US008691389B2

(12) United States Patent
Fu et al.

(10) Patent No.: US 8,691,389 B2
(45) Date of Patent: Apr. 8, 2014

(54) METHOD OF NANOPATTERNING, A CURED RESIST FILM USE THEREIN, AND AN ARTICLE INCLUDING THE RESIST FILM

(75) Inventors: Peng Fei Fu, Midland, MI (US); Lingjie Jay Guo, Ann Arbor, MI (US)

(73) Assignee: Dow Corning Corporation, Midland, MI (US)

( * ) Notice: Subject to any disclaimer, the term of this patent is extended or adjusted under 35 U.S.C. 154(b) by 1266 days.

(21) Appl. No.: 11/916,003

(22) PCT Filed: Nov. 30, 2005

(86) PCT No.: PCT/US2005/043278
§ 371 (c)(1), (2), (4) Date: Nov. 29, 2007

(87) PCT Pub. No.: WO2006/132672
PCT Pub. Date: Dec. 14, 2006

(65) Prior Publication Data

US 2009/0202788 A1 Aug. 13, 2009

Related U.S. Application Data

(60) Provisional application No. 60/686,432, filed on Jun. 2, 2005.

(51) Int. Cl.
*B32B 27/28* (2006.01)
*B32B 38/10* (2006.01)
*C08J 7/12* (2006.01)
*C08J 5/18* (2006.01)

(52) U.S. Cl.
USPC ........ 428/447; 428/195.1; 264/293; 264/494; 264/496; 427/156; 977/887; 977/888

(58) Field of Classification Search
USPC ............... 428/195.1, 447; 264/293, 494, 496; 427/156; 977/887, 888
See application file for complete search history.

(56) References Cited

U.S. PATENT DOCUMENTS 5,286,681 A * 2/1994 Maeda et al. ................. 438/760
5,629,399 A 5/1997 Juen et al.
2002/0158317 A1* 10/2002 Becker et al. ................ 257/678

FOREIGN PATENT DOCUMENTS

CN 1171415 1/1998
JP 62-269140 A * 11/1987 ............... G03C 5/00

OTHER PUBLICATIONS

Schmid et al; Macromolecules; 2000, 33, pp. 3042-3049.*

(Continued)

*Primary Examiner* — Robert C Boyle
(74) *Attorney, Agent, or Firm* — Howard & Howard Attorneys PLLC

(57) ABSTRACT

A method of nanopatterning includes the steps of providing the resist film (12) and forming the pattern in the resist film (12). The resist film (12) includes an organosilicone compound having at least two vinyl groups, an organosilicone crosslinker different from the organosilicone compound, a catalyst, and a catalyst inhibitor. The cured resist film (12) includes the reaction product of the organosilicone compound having at least two vinyl groups and the organosilicone crosslinker different from the organosilicone compound, in the presence of the catalyst and the catalyst inhibitor. The article (10) includes a substrate (14), and the cured resist film (12) is disposed on the substrate (14). Due to the presence of the catalyst inhibitor in the resist film (12), the resist film (12) may be manipulated for hours at room temperature without curing. At the same time, the resist film (12) cures in a sufficiently short period of time to be commercially valuable.

7 Claims, 3 Drawing Sheets

(56) References Cited

OTHER PUBLICATIONS

JP 62-269140 A; Iwamoto et al, Abstract in English; Nov. 1987.*

Malaquin et al, "Using polydimethylsiloxane as a thermocurable resist for a soft imprint lithography process", Microelectronic Engineering, vol. 61-62, 2002, pp. 379-384.

Sun et al, "Multilayer resist methods for nanoimprint lithography on nonflat surface", Journal of Vacumn Science & Technology B, vol. 16, No. 6, 1998, pp. 3922-3925.

Lebib et al, "Tri-layer systems for nanoimprint lithography with an improved process latitude", Microelectronic Engineering, No. 53, 2000, pp. 175-178.

* cited by examiner

METHOD OF NANOPATTERNING, A CURED RESIST FILM USE THEREIN, AND AN ARTICLE INCLUDING THE RESIST FILM

RELATED APPLICATIONS

This application claims priority to and all the advantages of International Patent Application No. PCT/US2005/043278, filed on Nov. 30, 2005, which claims priority to U.S. Provisional Patent Application No. 60/686,432, filed on Jun. 2, 2005.

GOVERNMENT LICENSE RIGHTS

The U.S. Government has a paid-up license in this invention and the right in limited circumstances to require the patent owner to license others on reason-able terms as provided for by the terms of grant number ECF 0424204 awarded by the National Science Foundation.

FIELD OF THE INVENTION

The present invention generally relates to a method of nanopatterning, a cured resist film having a pattern formed therein, and an article including the resist film. More specifically, the cured resist film provides many advantages over resist films that include conventional polymeric materials.

BACKGROUND OF THE INVENTION

Nanopatterning is an essential part of nanotechnology research for fabricating nanostructures. For these nanostructures and nanopatterning techniques to have significant practical value, low cost and high throughput nanopatterning techniques are indispensable. Among many new emerging techniques that are aimed at lowering cost and increasing throughput, nanoimprint lithography (NIL) is regarded as a promising technique. NIL has the capability of patterning sub-10 nm structures, yet only entails simple equipment setup and easy processing. As such, NIL has been applied in the fabrication of numerous electric and optical devices, and also in wafer-scale processing.

One approach to NIL involves thermal embossing. For the thermal embossing, a resist film is formed on a substrate, generally through spin-coating a polymeric material onto the substrate to form the resist film. Conventional polymeric materials included in the resist film include thermoplastic materials such as polystyrene and poly(methyl methacrylate). A pattern is formed in the resist film with a mold under high pressures and heat.

One of the problems with thermal embossing the thermoplastic materials is that the viscosity of the thermoplastic materials is quite high, even after heating the thermoplastic materials above a $T_g$ of the materials. As a result, the thermal embossing typically requires high pressure and a long imprinting time of from 10 min to over 60 minutes, which affects formation rates of the patterns. In addition, the resist films formed from the thermoplastic materials does not have temperature stability above the $T_g$ of the materials, which may limit the scope of application for the thermoplastic materials.

One approach to resolve the problems is to use a precursor that can be cured during the nanoimprint process to form the desired patterns. Carcenac et al. have employed Sylgard 184® as a curable precurser. (Carcenac et al., "Tri-Layer Systems for Nanoimprint Lithography with an Improved Process Latitude", Microelectronics Engineering 53, 163 (2000)). Sylgard 184® includes three main components: a vinyl-terminated poly(dimethyl siloxane)-based polymer (vinyl-terminated PDMS-based polymer), a silyl-hydride crosslinker, and a platinum hydrosilylation catalyst. The vinyl-terminated PDMS-based polymer has a number average molecular weight of about 20,000 and a degree of polymerization (DP) of about 400. In addition, the platinum hydrosilylation catalyst is present in an amount of about 10 ppm.

One of the problems with the use of Sylgard 184® is that the cure time is too long to have any commercial value for nanopatterning. More specifically, the Sylgard 184® takes 24 hours to cure at 25° C., 4 hours to cure at 65° C., 1 hour at 100° C., and 15 minutes at 150° C., all at a pressure of 10 bar. Even if the amount of catalyst in the Sylgard 184® is increased to 0.01% by weight, curing still takes over five minutes at 150° C., which is insufficient to be commercially valuable.

Step-and-Flash Imprint Lithography (S-FIL). S-FIL is another technique of nanopatterning based on mechanical imprinting, but uses a UV curable liquid material as a liquid resist. With S-FIL, the liquid resist is dispensed in droplet form onto a substrate, and then a template is brought into contact with the substrate and pressed against the substrate to spread out the liquid resist thereby forming a film of the liquid resist. This film is then cured by exposure to UV light. S-FIL can be carried out at room temperature and, therefore, does not require high temperatures like conventional NIL. However, S-FIL is still not ideal because conventional UV curable liquid materials used in S-FIL are typically based on a mechanism involving free radical polymerization of acrylic functional monomers and oligomers. The UV curable liquid materials typically exhibit extensive shrinkage after cure. Furthermore, the UV curable liquid materials are prone to oxygen sensitivity whereby oxygen scavenges free radical species and inhibits polymerization at a surface of the resist film. As a result, the resist film is prone to defect generation in the resultant pattern formed in the resist film.

Thus, there remains a need for a method of nanopatterning that improves upon the deficiencies of conventional nanopatterning using the conventional polymeric materials. Namely, there remains a need for a resist film to be used in the method of nanopatterning that includes a curable liquid material that is resistant to shrinkage after cure and insensitive to oxygen, yet is cured in a sufficiently short period of time to be commercially valuable.

SUMMARY OF THE INVENTION AND ADVANTAGES

The subject invention provides a method of nanopatterning, a cured resist film having a pattern formed therein, and an article including the resist film. The method of nanopatterning includes the steps of providing the resist film and forming the pattern in the resist film. The resist film includes an organosilicone compound having at least two vinyl groups, an organosilicone crosslinker different from the organosilicone compound, a catalyst, and a catalyst inhibitor. As such, the cured resist film includes the reaction product of the organosilicone compound having at least two vinyl groups and the organosilicone crosslinker different from the organosilicone compound, in the presence of the catalyst and the catalyst inhibitor. The article includes a substrate, and the cured resist film is disposed on the substrate.

Due to the presence of the catalyst inhibitor in the resist film, the resist film may be manipulated for hours at room temperature without starting to cure. At the same time, the organosilicone compound, organosilicone crosslinker, and catalyst may be formulated to cure in a sufficiently short period of time, once the reaction begins, due to the presence of the catalyst inhibitor. As a result, once the reaction between the organosilicone compound and the organosilicone crosslinker begins, the resist film cures in a sufficiently short period of time to be commercially valuable, since commercial applications often require high throughput. Furthermore, the cured resist film of the subject invention is resistant to shrinkage after cure, insensitive to oxygen, has low surface energy, and has high resistance to oxygen plasma etching.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE PREFERRED EMBODIMENTS

A method of nanopatterning according to the present invention is primarily used in nanotechnology research. Known processes that may be characterized as nanopatterning include, but are not limited to, nano- and micro-lithography, also referred to as nanoimprint lithography (NIL) and microprint lithography, respectively, nanoscale contact printing, UV-assisted nanoimprint lithography, Step-and-Flash Nanoimprint Lithography (S-FIL), and combined-nanoimprint-and-photolithography. These processes have proven particularly useful in the fabrication of numerous electric and optical devices, and also in wafer-scale processing.

Figure 1:
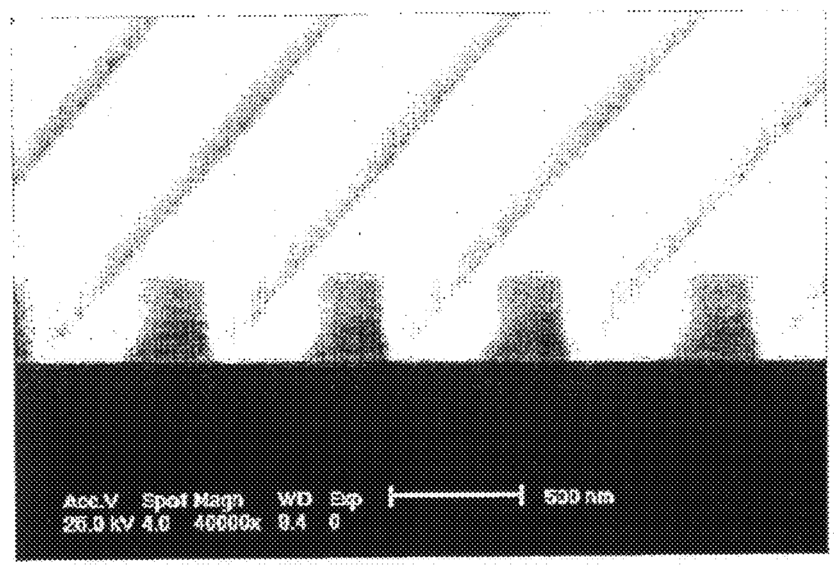
FIG. 1 is a scanning electron microscopy (SEM) micrograph illustrating a pattern having a 350 nm line width on a resist film of the present invention.
Figure 2:
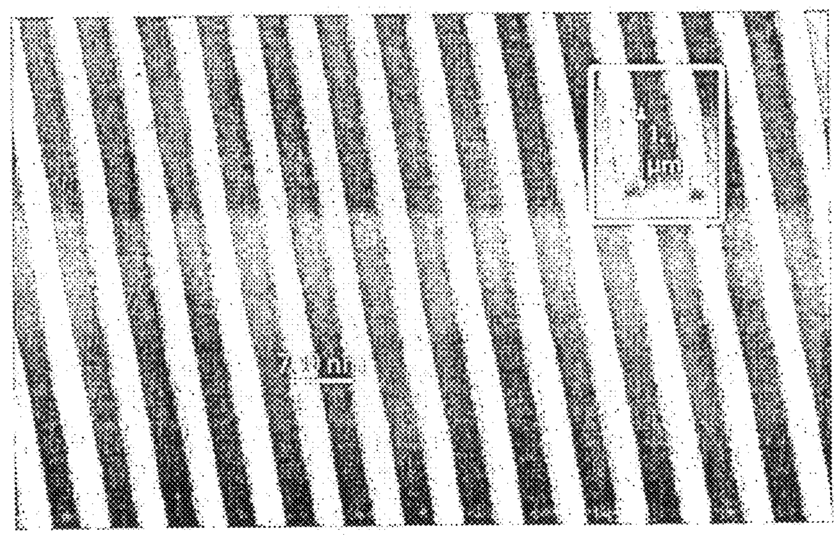
FIG. 2 is a SEM micrograph illustrating a pattern having a 250 nm line width and 1.8 micrometer line height on a resist film of the present invention.

In nanopatterning, a resist film 12 is provided and is typically formed on a substrate 14; however, it is to be appreciated that the resist film 12 may be formed freestanding from the substrate 14. As shown in FIGS. 1 and 2, a pattern is formed in the resist film 12. The pattern may be formed through various mechanisms, such as with a mold, or through masking and etching, which is described in further detail below. When the mold is used, the pattern is typically formed in the resist film 12 under controlled temperature and low pressure. More specifically, a pattern is transferred from a surface of the mold to the resist film 12. The resist film 12 is then cured, as will be described in further detail below, to form a cured resist film 12. The cured resist film 12, in combination with the substrate 14, forms an article 10, which is basically a patterned structure on the substrate 14. Preferably, the substrate 14 is formed from silicon or glass, but may also be formed from metal and plastic.

The resist film 12 used in the method of nanopatterning of the subject invention includes an organosilicone compound, an organosilicone crosslinker, a catalyst, and a catalyst inhibitor. The organosilicone compound, organosilicone crosslinker, catalyst, and catalyst inhibitor may each be provided separately, in a single mixture, or as two or more mixtures of one or more of those components. Regardless of how provided, the components are all mixed together, and the resulting mixture, which is liquid in form, is applied to the substrate 14 to form the resist film 12. As used herein, the resist film 12 refers to an uncured film of the liquid mixture formed from the organosilicone compound, organosilicone crosslinker, catalyst, and catalyst inhibitor, and "cured" resist film 12 refers to the resist film 12 after curing the mixture to form a reaction product of the organosilicone compound and the organosilicone crosslinker in the presence of the catalyst and further in the presence of the catalyst inhibitor.

To form the resist film 12 on the substrate 14, the liquid mixture is applied onto the substrate 14, typically through at least one of spin-coating, dip-coating, and spray-coating the mixture onto the substrate 14. Alternatively, the mixture may be applied to the substrate 14 as liquid droplets. The pattern is typically formed in the resist film 12 with pressures in the range of no greater than 14 bar, preferably from about 0.1 to about 14 bar, at room temperature. The resist film 12 is then cured at a temperature of from 20 to 150° C., preferably from 60 to 120° C., most preferably from about 80° C. to about 100° C., after which the mold is separated from the resist film 12. The resist film 12 is cured for a period of no greater than five minutes, which forms the cured resist film 12. Typically, the resist film 12 cures in a period of less than one minute at a temperature of no greater than 120° C.

Figure 3:
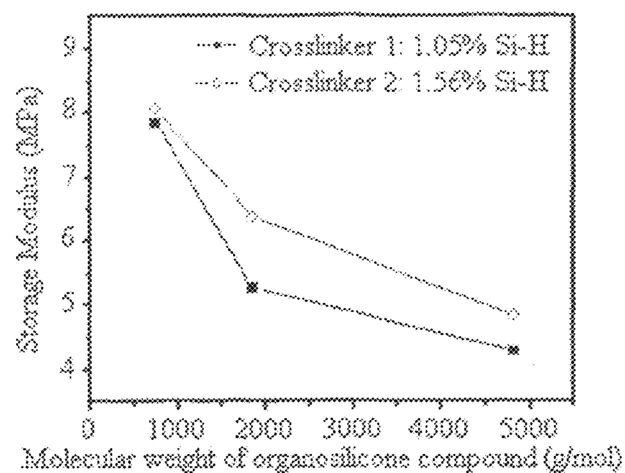
FIG. 3 is a graph illustrating a relationship between number average molecular weight of an organosilicone compound, an amount of Si—H groups in an organosilicone crosslinker, and storage modulus in a cured resist film.
Figure 4:
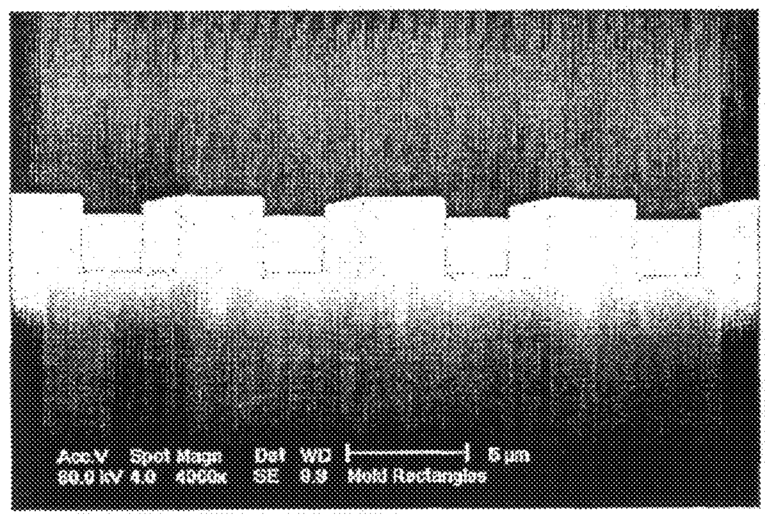
FIG. 4 is a scanning electron microscopy (SEM) micrograph illustrating micron-scale patterns on a resist film of the present invention.
Figure 5:
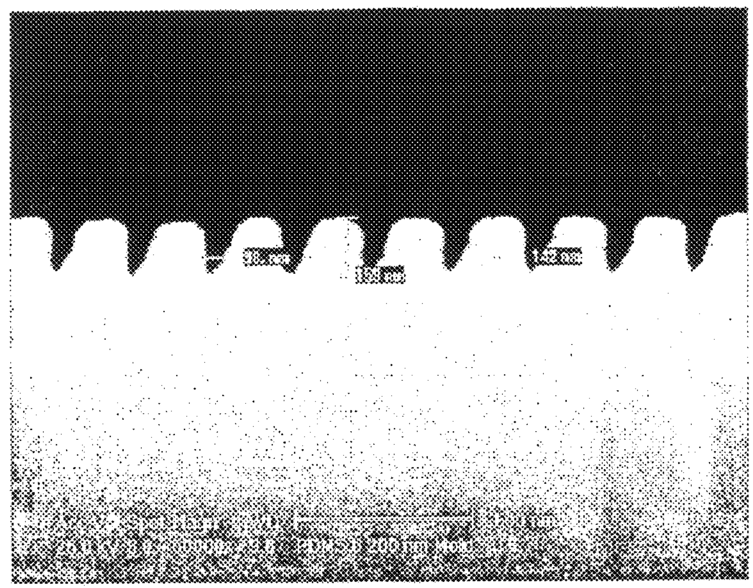
FIG. 5 is a SEM micrograph illustrating a pattern having a 140 nm line width grating pattern on a resist film of the present invention.

The organosilicone compound has at least two vinyl groups. Furthermore, the organosilicone compound includes a silicone group selected from the group of an ($SiRR'O_{2/2}$) group, an ($SiRO_{3/2}$) group, and combinations thereof, wherein R and R' are each selected from the group of an amino group, a hydroxyl group, an ether group, a carboxyl group, hydrogen, a phenyl group, a hydrocarbon group, a fluorocarbon group, and combinations thereof. For example, in one embodiment, the organosilicone compound has the structure:

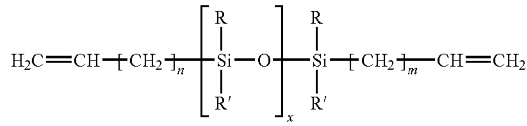

wherein n and m are both ≥0 and x is at least 5. Preferably, the organosilicone compound has a number average molecular weight of no greater than 10,000 Daltons. More preferably, the organosilicone compound has a number average molecular weight of no greater than 5,000 Daltons. Referring to FIG. 3, the number average molecular weight of the organosilicone compound affects a storage modulus, or modulus of elasticity, of the cured resist film 12. The storage modulus of the cured resist film 12 is described in further detail below. The number average molecular weight of the organosilicone compound, which is substantially lower than the number average molecular weight of organosilicone compounds used in the prior art, also contributes to the curing in the sufficiently short period of time, which is also described in further detail below.

Typically, the organosilicone compound is present in the resist film 12 in an amount of about 94 parts by weight based on the combined weight of the organosilicone compound, the organosilicone crosslinker, the catalyst, and the catalyst inhibitor. In other words, other components, such as additives, may be included in the resist film 12, and the amount of the organosilicone compound present may be less than 94 parts by weight of the resist film 12 when the additives are included in the resist film 12. Suitable additives that may be included in the resist film 12 are described in further detail below.

The organosilicone crosslinker is different from the organosilicone compound and typically includes at least three Si—H groups. However, it is to be appreciated that in an alternative embodiment, the organosilicone crosslinker may include at least two Si—H groups. For example, the organosilicone crosslinker may include only two Si—H groups, in which case the organosilicone compound has at least three vinyl groups to achieve a suitable cross-linking density in the cured resist film 12. The cross-linking density in the cured resist film 12 is dependent upon the number of reactive groups, i.e., vinyl or Si—H groups, present in the resist film 12 before curing. For example, a higher cross-linking density is achieved when an organosilicone crosslinker having a higher percentage of Si—H groups is used. The higher cross-linking density is another factor that affects the storage modulus of the cured resist film 12.

Typically, the organosilicone crosslinker has the structure:

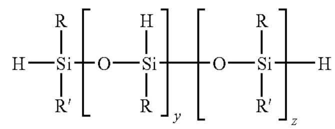

wherein y and z are each ≥1, and R and R' are each selected from the group of an amino group, a hydroxyl group, an ether group, a carboxyl group, hydrogen, a phenyl group, a hydrocarbon group, a fluorocarbon group, and combinations thereof. The vinyl groups of the organosilicone compound and the Si—H groups of the organosilicone crosslinker are reactive with each other through what is known in the art as a hydrosilylation reaction. The cured resist film 12, after the vinyl groups and the Si—H groups have reacted, includes the reaction product of the organosilicone compound and the organosilicone crosslinker that is formed in the presence of the catalyst and further in the presence of the catalyst inhibitor.

Typically, at least 1.2 Si—H groups of the organosilicone crosslinker are present for each vinyl group of the organosilicone compound to achieve a sufficient cross-linking density in the cured resist film 12. Since the organosilicone crosslinker has a lower number average molecular weight than the organosilicone compound, less organosilicone crosslinker is typically required, as compared to the amount of organosilicone compound required, to obtain the desired number of Si—H groups of the organosilicone crosslinker to vinyl groups of the organosilicone compound. More specifically, the organosilicone crosslinker is typically present in an amount of no greater than 5 parts by weight based on the combined weight of the organosilicone compound, the organosilicone crosslinker, the catalyst, and the catalyst inhibitor. The amount of the organosilicone crosslinker in the resist film 12 may be lower than 5 parts by weight based on the total weight of the resist film 12 when non-reactive diluents and other additives are present in the resist film 12.

The use of cured organosilicone material as the resist film 12 offers many advantageous properties. For example, the cured resist film 12 is capable of resisting fracture and delamination during mold release due to the presence of the silicone therein, which imparts elasticity to the cured resist film 12. Furthermore, the presence of the silicone also imparts relatively low surface energy to the resist film 12, thereby providing for relatively easy mold release from the surface of the mold as compared to conventional materials. The cured resist film 12 formed from the organosilicone compound and the organosilicone crosslinker also exhibits excellent resistance to oxygen plasma etching, as described in further detail below.

The hydrosilylation reaction between the organosilicone compound and the organosilicone crosslinker typically requires the presence of the catalyst and proceeds according to the following equation:

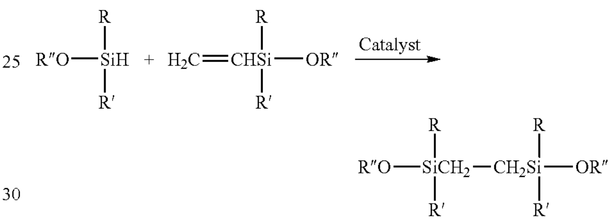

wherein R and R' are the same as above, and R" represents the rest of either the organosilicone compound or organosilicone crosslinker that is not participating in the specific reaction as illustrated. Suitable catalysts for catalyzing the reaction between the vinyl group and the Si—H group are based on a transition metal compound. More specifically, the suitable catalysts may be a group VIII element-based compound selected from the group of platinum-based compounds, rhodium-based compounds, cobalt-based compounds, and combinations thereof. Preferably, the catalyst is a platinum-based compound or a rhodium-based compound that catalyzes the hydrosilylation reaction, including chloroplatinic acid in alcohol, platinum-divinyltetramethyldisiloxane complex, chlorotris(triphenylphosphine)rhodium, and combinations thereof. Preferably, the catalyst is present in an amount of from 2 to 500 ppm, more preferably from 10 to 150 ppm, most preferably from 60 to 100 ppm, based on the combined amount of organosilicone compound, organosilicone crosslinker, catalyst, and catalyst inhibitor.

Due to the relatively low number average molecular weight of the organosilicone compound and the relatively high amount of the catalyst present in the resist film 12, the resist film 12 typically cures in a period of less than five minutes in a temperature range of from 20 to 150° C. More specifically, the resist film 12 typically cures in a period of less than one minute at a temperature of no greater than 120° C. Such low curing times are sufficiently quick to make the resist films 12 formed in accordance with the subject invention commercially valuable. However, premature reaction of the vinyl groups and the Si—H groups may occur absent the catalyst inhibitor. Thus, the catalyst inhibitor is present to prevent the premature reaction. The catalyst inhibitor typically interacts with and deactivates the catalyst at ambient temperature. When an elevated reaction temperature is established, the catalyst inhibitor decomposes to release the catalyst into an active form. Suitable catalyst inhibitors may be selected from the group of acetylenic alcohols, fumarates, maleates, and combinations thereof. Specific examples of suitable catalyst inhibitors include dimethyl fumarate, dimethyl maleate, dially fumarate, dially maleate. Typically, the catalyst inhibitor is present in an amount of from 0.1 to 2 parts by weight based on the combined weight of the organosilicone compound, the organosilicone crosslinker, the catalyst, and the catalyst inhibitor.

An additive may be included in the resist film 12 to modify, as necessary, desired physical and chemical properties. Additives typically do not integrate into the reaction product of the organosilicone compound and the organosilicone crosslinker and are typically used in relatively small amounts. If included, such additives include, but are not limited to, those selected from the group of stabilizers, adhesion promoters, mold release agents, non-reactive diluents, and combinations thereof. The stabilizers are used to prevent premature reaction and gelation in storage. The adhesion promoters, such as 3-glycidoxypropyltrimethoxysilane, are utilized to improve surface adhesion of the substrate 14. The release agents are used to reduce the surface energy of the contact surfaces involved in the various techniques. The non-reactive diluents may be included in the mixture that includes the organosilicone compound, organosilicone crosslinker, catalyst, and catalyst inhibitor to lower a viscosity of the mixture, thereby allowing a desired thickness of the resist film 12 to be achieved. Non-reactive diluents typically include solvents having a boiling point in excess of 80° C. such as PGMEA, 2-heptanone, xylene, dimethylsiloxane cyclics, and combinations thereof.

The viscosity of the mixture including the organosilicone compound, organosilicone crosslinker, catalyst, and catalyst inhibitor, as well as any additives, is low in that it can be adequately applied onto the substrate 14. Preferably, the mixture has a kinematic viscosity that ranges from 1 to 10,000, more preferably from 10 to 1,000, and most preferably from 10 to 200, centistokes (cSt) at room temperature (approximately 20° C.). Varying the amount of the reactive diluent relative to the other components in the mixture assists in controlling the thickness of the resist film 12. A lower viscosity of the mixture helps achieve a thinner resist film 12. The thickness of the resist film 12 may range from sub-100 nm to several microns.

The cured resist film 12 has an ideal storage modulus to ensure excellent mechanical integrity of the cured resist film 12 while resisting fracture and delamination during mold release. More specifically, cured resist films 12 having a storage modulus that is too high are often brittle and tend to break easily during mold separation, and resist films 12 formed having a storage modulus that is too low are prone to collapse after pattern formation. Referring to FIG. 3, the storage modulus of the cured resist film 12 is affected by the number average molecular weight of the organosilicone compound and the crosslink density of the cured resist film 12. As such, the storage modulus may be modified by adjusting the number average molecular weight of the organosilicone compound and adjusting a relative amount of Si—H groups present in the resist film 12 to obtain the cured resist film 12 having the desired storage modulus. Typically, the storage modulus is from 1000 to 5000 MPa.

Figure 6:
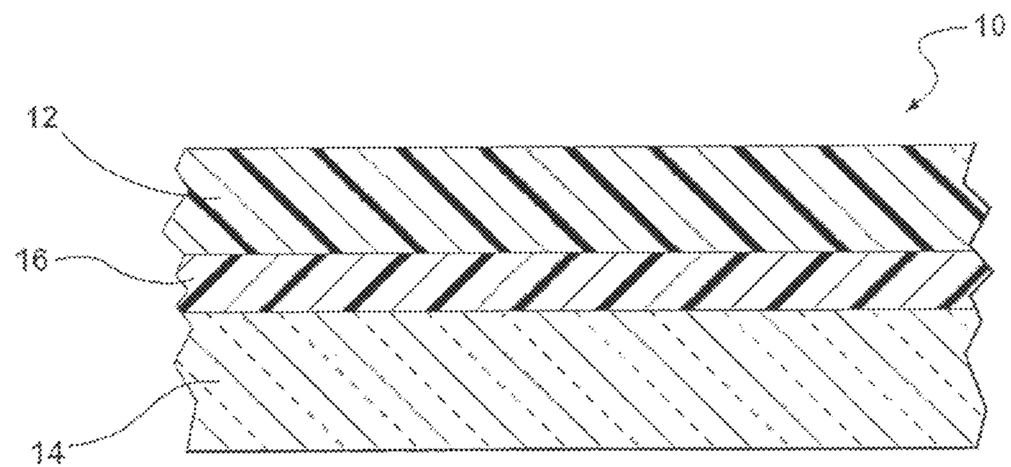
FIG. 6 is side schematic view of an article including a substrate, a planarizing layer or underlayer, and the resist film.

In one embodiment, the mixture of the organosilicone compound, organosilicone crosslinker, catalyst, and catalyst inhibitor, as well as any additives, is applied directly to the substrate 14 to form the resist film 12. As shown in FIGS. 1 through 5, the pattern may then be formed in the resist film 12. In another embodiment, as shown in FIG. 6, a planarizing film 16 is formed on the substrate 14. The mixture of the organosilicone compound, organosilicone crosslinker, catalyst, catalyst inhibitor, and any additives is applied to the planarizing film 16 to form the resist film 12. As such, the planarizing film 16 is disposed between the substrate 14 and the resist film 12.

The planarizing film 16 is formed from a polymer, and the step of forming the planarizing film 16 is more specifically defined as applying the polymer onto the substrate 14 to form the planarizing film 16 on the substrate 14. The polymer may have an oxygen plasma etch rate greater than an oxygen plasma etch rate of the reaction product of the organosilicone compound and the organosilicone crosslinker for reasons to be described below. More specifically, the polymer may have an oxygen plasma etch rate that is at least 10 times greater than the oxygen plasma etch rate of the organosilicone compound and the organosilicone crosslinker, and may be in excess of 100 times greater than the oxygen plasma etch rate of the reaction product of the organosilicone compound and the organosilicone crosslinker. In other instances, it may be desirable for the planarizing film 16 to have a high oxygen plasma etch resistance when it is used as a masking material during pattern transfer into the underlying substrate 14.

The polymer is typically an amorphous polymer having a $T_g$ of at least 30° C. The polymer may be selected from the group of, but is not limited to, poly(methyl methacrylate) (PMMA), polystyrene, polysilsesquioxane, and combinations thereof. However, other polymers including, but not limited to, polystyrene and polysilsesquioxanes, may also be suitable. One use for the planarizing film 16 formed from the polymer is for achieving better wetting of the substrate 14 by the resist film 12, during spin-coating of the mixture including the organosilicone compound, organosilicone crosslinker, catalyst, catalyst inhibitor, and any additives onto the substrate 14. The better wetting of the substrate 14 ensures uniformity of the resist film 12.

The planarizing film 16 may serve as a etch mask during pattern transfer into the underlying substrate 14 in a plasma etching process, and certain etch-resistance are desired. It may also be used as a sacrificial layer in a lift-off process or to obtain large aspect-ratio structures. In the lift-off process, the planarizing film 16 is formed on the substrate 14, and the resist film 12 is formed on the planarizing film 16. The pattern, which is typically a short aspect-ratio structure, is then formed in the resist film 12. The resist film 12 is then cured to form the cured resist film 12, which includes the reaction product of the organosilicone compound and organosilicone crosslinker. Some of the reaction product of the organosilicone compound and the organosilicone crosslinker remains in the pattern of the cured resist film 12. The reaction product of the organosilicone compound and the organosilicone crosslinker is typically sensitive to certain plasma etching, such as fluorine plasma etching, and differences between fluorine plasma etch rates of the polymer in the planarizing film 16 and the cured resist film 12 may not be as pronounced as the differences between the respective oxygen plasma etch rates. As such, the reaction product of the organosilicone compound and the organosilicone crosslinker remaining in the pattern is fluorine plasma etched from the pattern in the cured resist film 12 to expose the planarizing film 16. Oxygen plasma etching is then used to form a pattern in the planarizing film 16. Although the reaction product of the organosilicone compound and the organosilicone crosslinker in the cured resist film 12 is also subjected to the oxygen plasma etching, due to extreme differences in the oxygen plasma etch rates of the polymer in the planarizing film 16 and the reaction product of the organosilicone compound and the organosilicone crosslinker in the cured resist film 12, etching of the resist film 12 is negligible as compared to etching of the planarizing film 16. As such, the cured resist film 12 functions as a mask to the planarizing film 16, and the planarizing film 16 is further etched beneath the cured resist film 12 to form an undercut feature. Optionally, a metal layer, more specifically metal lines, may be disposed on the cured resist film 12. The planarizing film 16 may be etched as described above, then the metal layer may be disposed on the cured resist film 12 as desired. Exposed cured resist film 12 may then be at least partially dissolved with an appropriate solvent to achieve liftoff of the metal layer.

The following examples illustrating the method of nanopatterning, the cured resist film 12 having the pattern formed therein, and the article 10 including the resist film 12, as presented herein, are intended to illustrate and not limit the invention.

EXAMPLES

A planarizing film 16 including PMMA is first formed on a silicon substrate 14. More specifically, the PMMA is dissolved in toluene to form a planarizing solution, which is spin-coated onto the silicon substrate 14 to form the planarizing film 16. The planarizing film 16 has a thickness of about 400 nm. A mixture of an organosilicone compound, an organosilicone crosslinker, a catalyst, a catalyst inhibitor, and additives is then formed. More specifically, the mixture includes 10 g of divinyl-terminated poly(dimethyl siloxane) having a number average molecular weight of about 1850 Daltons, 1.09 g of a silyl hydride-based dimethylsiloxane having three Si—H groups and a number average molecular weight of about 1200 Daltons, 0.27 g of platinum-divinyltetramethyldisiloxane complex in silicone fluid (0.054% of Pt by weight), and 28 mg of. dimethyl maleate The mixture is spin-coated onto the planarizing film 16 to form a resist film 12 having a thickness of about 300 nm. Various nano- and micron-scale patterns are formed in the resist film 12 using a NX-1000 imprinter commercially available from Nanonex, Inc. of Monmouth Junction, N.J. Scanning electron microscopy (SEM) micrographs of these exemplary patterns are illustrated in FIGS. 1 and 2. The patterns are formed through imprinting so as not to completely extend through the resist film 12 into the planarizing film 16. Imprinting is performed at a pressure of from about 0.1 to about 14 bar. (see, for example, FIG. 1). The resist film 12 is then cured at a temperature of about 80° C. for a period of about one minute to form the cured resist film 12 including the reaction product of the organosilicone compound and the organosilicone crosslinker in the presence of the catalyst and further in the presence of the inhibitor. After imprinting, the mold and the substrate 14 are separated and a replica of the mold pattern is imprinted into the resist film 12.

Residual reaction product of the organosilicone compound and the organosilicone crosslinker in the pattern is removed through fluorine plasma etching to expose the planarizing film 16. A large aspect-ratio imprinting process is then carried out by oxygen plasma etching the resist film 12 and the planarizing film 16. The oxygen plasma etch rate of the reaction product of the organosilicone compound and the organosilicone crosslinker is less than 5 nm/min, depending upon exact composition, and the oxygen plasma etch rate of the PMMA is about 110 nm/min.

The invention has been described in an illustrative manner, and it is to be appreciated that the terminology which has been used is intended to be in the nature of words of description rather than of limitation. Obviously, many modifications and variations of the present invention are possible in view of the above teachings. It is, therefore, to be appreciated that within the scope of the claims the invention may be practiced otherwise than as specifically described.

What is claimed is:

1. A method of nanopatterning comprising the steps of:
providing a substrate (14);
providing a resist film (12) on the substrate (14), the resist film (12) including:
an organosilicone compound having at least two vinyl groups and having a number average molecular weight of no greater than 10,000 Daltons,
an organosilicone crosslinker different from the organosilicone compound,
a catalyst present in an amount of from 10 to 500 ppm, and
a catalyst inhibitor;
forming a pattern in the resist film (12);
curing the resist film (12) at a temperature of from 20 to 150° C. and a pressure of no greater than 14 bar for a period of no greater than five minutes to form a cured resist film (12);
etching the substrate (14) by using the pattern in the cured resist film (12) as a mask to form a pattern in the substrate (14), wherein the etching is selective to the substrate (14); and
removing the cured resist film (12) from the substrate (14).

2. A method as set forth in claim 1 wherein the catalyst inhibitor is selected from the group of acetylenic alcohols, fumarates, maleates, and combinations thereof.

3. A method as set forth in claim 1 wherein the organosilicone compound includes a silicone group selected from the group of an ($SiRR'O_{2/2}$) group, an ($SiRO_{3/2}$) group, and combinations thereof, with R and R' each selected from the group of an amino group, a hydroxyl group, an ether group, a carboxyl group, hydrogen, a phenyl group, a hydrocarbon group, a fluorocarbon group, and combinations thereof.

4. A method as set forth in claim 3 wherein the organosilicone compound has the structure:

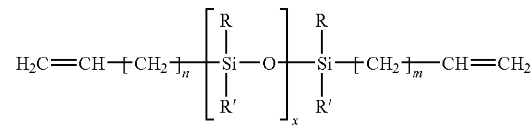

wherein n and m are both ≥0 and x is at least 5.

5. A method as set forth in claim 1 further comprising the step of applying a mixture of the organosilicone compound, the organosilicone crosslinker, the catalyst, and the catalyst inhibitor onto a substrate (14) to form the resist film (12).

6. A method as set forth in claim 1 further comprising the step of applying a polymer to the substrate (14) to form a planarizing film (16) on the substrate (14).

7. A method as set forth in claim 6 further comprising the step of applying a mixture of the organosilicone compound, the organosilicone crosslinker, the catalyst, and the catalyst inhibitor onto the planarizing film (16) to form the resist film (12).

* * * * *